United States Patent
Shin

(10) Patent No.: US 8,625,380 B2
(45) Date of Patent: Jan. 7, 2014

(54) INTERNAL VOLTAGE GENERATING CIRCUIT OF PHASE CHANGE RANDOM ACCESS MEMORY DEVICE AND METHOD THEREOF

(71) Applicant: SK hynix Inc., Gyeonggi-do (KR)

(72) Inventor: Yoon-Jae Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/713,862

(22) Filed: Dec. 13, 2012

(65) Prior Publication Data

US 2013/0121069 A1   May 16, 2013

Related U.S. Application Data

(62) Division of application No. 12/489,931, filed on Jun. 23, 2009, now Pat. No. 8,345,502.

(30) Foreign Application Priority Data

Dec. 26, 2008 (KR) .................. 10-2008-0134941

(51) Int. Cl.
*G11C 5/14* (2006.01)

(52) U.S. Cl.
USPC ................. 365/226; 365/227; 365/189.09

(58) Field of Classification Search
USPC ................... 365/226, 227, 189.09
See application file for complete search history.

(56) References Cited

U.S. PATENT DOCUMENTS 7,977,966 B2 *   7/2011   Lee et al. .................. 326/16

* cited by examiner

*Primary Examiner* — Vu Le
*Assistant Examiner* — Han Yang
(74) *Attorney, Agent, or Firm* — IP & T Group LLP

(57) ABSTRACT

An internal voltage generating circuit includes a divided voltage generator configured to generate a divided voltage by dividing a feedback internal voltage level at a division ratio corresponding to an operation mode control signal, a voltage detector configured to detect a level of the divided voltage based on a reference voltage level, an internal voltage generator configured to receive a supply voltage as power source and generate the internal voltage in response to an output signal of the voltage detector, and an under-driving unit configured to under-drive an internal voltage terminal to a supply voltage in an under-driving operation region that is determined in response to the operation mode control signal.

11 Claims, 4 Drawing Sheets

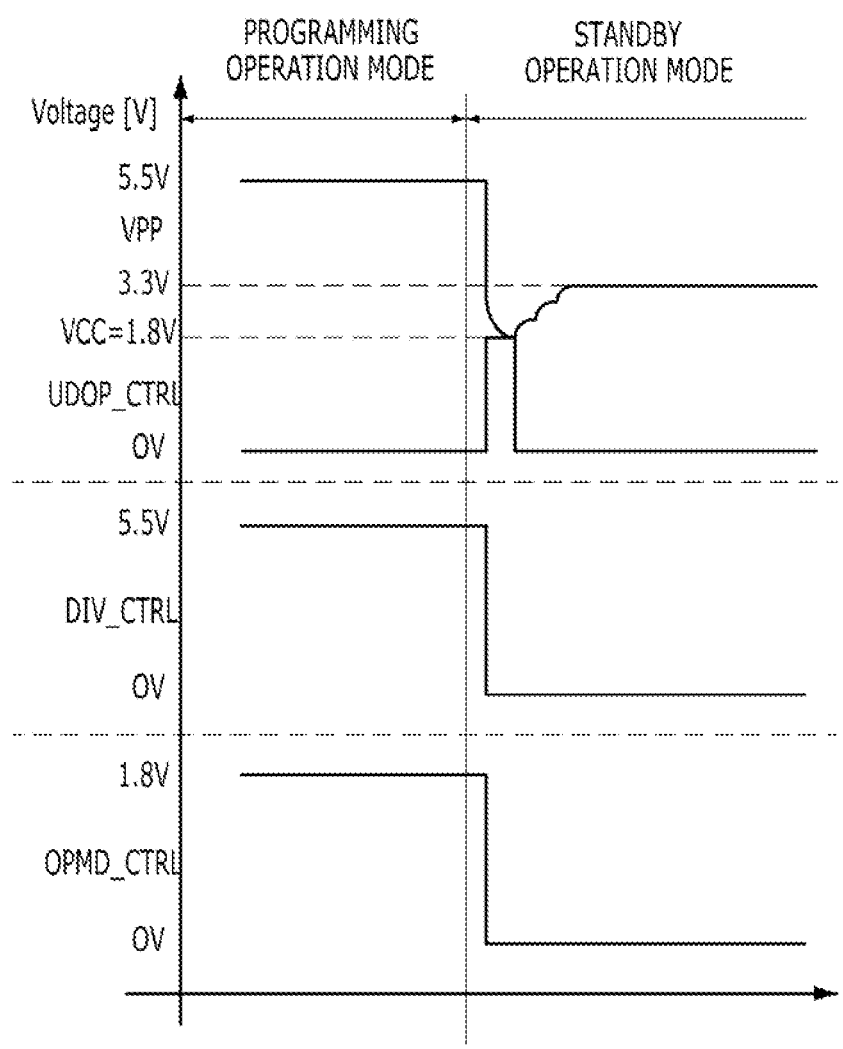

INTERNAL VOLTAGE GENERATING CIRCUIT OF PHASE CHANGE RANDOM ACCESS MEMORY DEVICE AND METHOD THEREOF

CROSS-REFERENCE TO RELATED APPLICATIONS

This application is a division of U.S. patent application Ser. No. 12/489,931 filed Jun. 23, 2009, which claims priority of Korean patent application number 10-2008-0134941, filed on Dec. 26, 2008. The disclosure of each of the foregoing applications is incorporated herein by reference in its entirety.

BACKGROUND OF THE INVENTION

The present invention relates to semiconductor design, and more particularly, to an internal voltage generating circuit of a phase change random access memory device and a method thereof.

In general, a phase change random access memory (PRAM) denotes a phase change memory. The PRAM is also referred to as an Ovonic unified memory (OUM).

Cells of the PRAM and the OUM are made of a phase change material that sustains one of two states when the phase change material is cooled down after being heated up. Also, the phase change material changes its state again when the material is heated up or cooled down again. For example, chalocogenide alloy is a representative phase change material of the PRAM or the OUM.

Two states of the phase change material are a crystalline state and an amorphous state. The phase change material included in the PRAM or the OUM has characteristics in which a resistance becomes low when the phase change material is in the crystalline state and the resistance becomes high when the phase change material is in the amorphous state.

Therefore, a logic value 0 or 1 is determined based on a resistance value of the phase change material included in the PRAM or the OUM. That is, the crystalline state of the phase change material corresponds to a logic value 0, and the amorphous state of the phase change material corresponds to a reset or a logic value 1.

In order to make the phase change material of the PRAM or the OUM to be in the amorphous state, the phase change material is quickly cooled down after being heated up to be higher than a temperature of a melting point through a resistance heat. On the contrary, in order to make the phase change material to be in the crystalline state, the phase change material is cooled down slowly after being heated up to be lower than a temperature of a melting point.

Meanwhile, it is difficult to apply a sufficient current to a phase change material using a supply voltage in a programming operation of a phase change memory device such as a PRAM or an OUM. Therefore, it is required to use a boost voltage having a higher voltage level than a level of the supply voltage in order to apply sufficient current to phase change memory cells to perform a programming operation.

If a driver for performing a programming operation receives a current from a supply voltage when the programming operation is performed on cells of a phase change memory such as a PRAM or an OUM, a necessary voltage to select phase change cells may become insufficient due to a voltage drop caused by a parasitic resistance formed between phase change memory cells.

Therefore, it may be necessary to use a boost voltage having a higher level than a supply voltage to perform a programming operation of a phase change memory device.

On the contrary, use of a boost voltage may be avoided in performing a read operation and a standby operation because it is not necessary to directly change a phase change material to an amorphous state or a crystalline state. The use of the boost voltage may be a factor to waste unnecessary current in the read operation and the standby operation of the phase change memory device.

Furthermore, if a high voltage such as a boost voltage is continuously applied to internal circuits of a phase change memory, the lifespan thereof may be abruptly shortened. Therefore, it is preferable to reduce a time of exposing internal circuits of a phase change memory to a high voltage such as a boost voltage during a read operation and a standby operation except a programming operation mode that requires the boost voltage.

SUMMARY OF THE INVENTION

Embodiments of the present invention are directed to providing a phase change memory device for dynamically changing a target level of an internal voltage generated through a charge pumping operation according to a programming operation mode or a read/standby operation.

In accordance with an aspect of the present invention, there is provided an internal voltage generating circuit including a divided voltage generator configured to generate a divided voltage by dividing a feedback internal voltage level at a division ratio corresponding to an operation mode control signal, a voltage detector configured to detect a level of the divided voltage based on a reference voltage level, an internal voltage generator configured to receive a supply voltage as a power source and generate the internal voltage in response to an output signal of the voltage detector, and an under-driving unit configured to under-drive an internal voltage terminal to a supply voltage in an under-driving operation region that is determined in response to the operation mode control signal.

In accordance with another aspect of the present invention, there is provided a method for generating an internal voltage of a phase change memory device, including generating a divided voltage by dividing an internal voltage level with a first division ratio in a programming operation mode corresponding to an operation mode control signal, generating the divided voltage by dividing the fed-back internal voltage level with a second division ratio in a read/standby operation mode corresponding to the operation mode control signal wherein the second division ratio is smaller than the first division ratio, detecting the divided voltage level based on a reference voltage level and generating the internal voltage based on a charge pumping method in response to the detection result, and under-driving an internal voltage terminal with a supply voltage for a predetermined time when the phase change memory device enters a read/standby operation mode corresponding to the operation mode control signal.

In accordance with another aspect of the present invention, there is provided a method for generating an internal voltage of a phase change memory device, including detecting an internal voltage level based on a first target level and generating the internal voltage using a charge pumping method in response to the detection result in a programming operation mode, detecting the internal voltage level based on a second target level and generating the internal voltage using a charge pumping method in response to the detection result wherein the second target level is lower than the first target level in a read/standby operation mode, and dropping a level of an internal voltage terminal to a supply voltage level for a predetermined time when the phase change memory device enters the read/standby operation mode.

BRIEF DESCRIPTION OF THE DRAWINGS

FIG. 4 is a timing diagram showing operation of an internal voltage generating circuit of a phase change memory device in accordance with an embodiment of the present invention.

DESCRIPTION OF SPECIFIC EMBODIMENTS

Hereinafter, a register controlled DLL circuit in accordance with the present invention will be described in detail with reference to the accompanying drawings.

Figure 1:
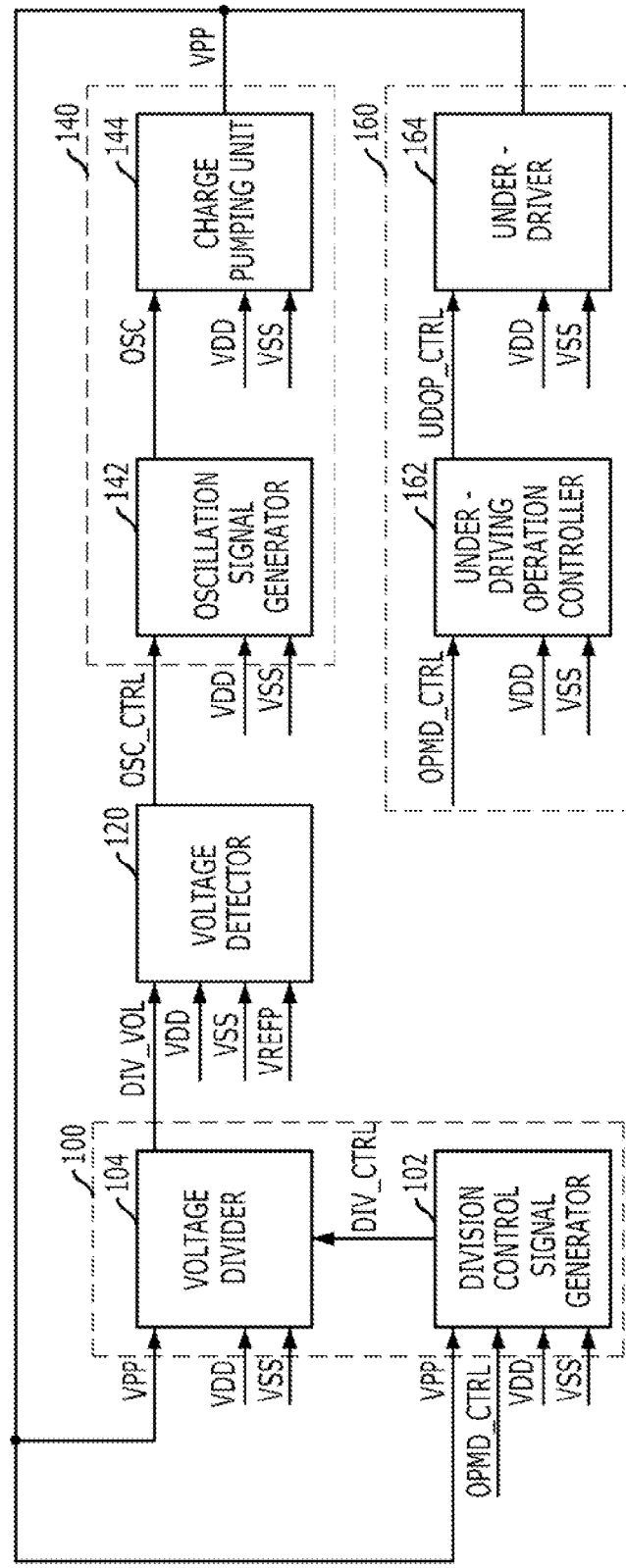
FIG. 1 is a block diagram illustrating a boost voltage generating circuit of a phase change memory device in accordance with an embodiment of the present invention.

FIG. 1 is a block diagram illustrating a boost voltage generating circuit of a phase change memory device in accordance with an embodiment of the present invention.

Referring to FIG. 1, the boost voltage generating circuit in accordance with the present embodiment includes a divided voltage generator 100, a voltage detector 120, a boost voltage generator 140, and an under-driving unit 160. The divided voltage generator 100 generates a divided voltage DIV_VOL by dividing a level of a fed-back boost voltage VPP by a division ratio corresponding to an operation mode control signal OPMD_CTRL. The voltage detector 120 detects a level of a divided voltage DIV_VOL based on a reference voltage VREFP level. The boost voltage generator 140 receives a supply voltage VDD as a power source and generates a boost voltage VPP using a charge pumping method in response to an output signal OSC_CTRL of the voltage detector 120. The under-driving unit 160 under-drives a boost voltage terminal with the supply voltage VDD in an under-driving operation region that is determined in response to the operation mode control signal OPMD_CTRL.

The divided voltage generator 100 includes a division control signal generator 102 and a voltage divider 104. The division control signal generator 102 receives the operation mode control signal OPMD_CTRL swinging between the supply voltage VDD and a ground voltage VSS and outputs the division control signal DIV_CTRL swinging between the boost voltage VPP and the ground voltage VSS. The voltage divider 104 determines a level of the divided voltage DIV_VOL by dividing the level of the boost voltage VPP by a division ratio changing response to the division control signal DIV_CTRL.

The boost voltage generator 140 includes an oscillation signal generator 142 and a charge pumping unit 144. The oscillation signal generator 142 generates an oscillation signal that toggles to a predetermined frequency in response to the output signal OSC_CTRL of the voltage detector 120. The charge pumping unit 144 increases a level of a boost voltage terminal by performing a positive charge pumping operation in response to the oscillation signal OSC.

The under-driving unit 160 includes an under-driving operation controller 162 and an under-driver 164. The under-driving operation controller 162 generates an under-driving operation control signal UDOP_CTRL in response to the operation mode control signal OPMD_CTRL. The under-driver 164 under-drives a level of the boost voltage terminal to a level of a supply voltage VDD in response to the under-driving operation control signal UDOP_CTRL.

The voltage detector 120 outputs an activated voltage detection signal OSC_CTRL if a reference voltage VREFP level is higher than a divided voltage DIV_VOL level and outputs an inactivated voltage detection signal OSC_CTRL if the reference voltage level is lower than the divided voltage level.

The boost voltage generator 140 increases the boost voltage level by performing a positive charge pumping operation in response to the activated voltage detection signal OSC_CTRL and do not increase the boost voltage level by not performing the positive charge pumping operation in response to the inactivated voltage detection signal OSC_CTRL.

In more detail, the oscillation signal generator 142 in the boost voltage generator 140 toggles the oscillation signal OSC to a predetermined frequency in response to the activation of the output signal OSC_CTRL of the voltage detector 120 and sets the oscillation signal OSC to a predetermined logical level, without toggling, in response to the inactivation of the output signal OSC_CTRL of the voltage detector 120.

Among the constituent elements of the boost voltage generator 140, the charge pumping unit 144 increases a level of a boost voltage terminal by performing a positive charge pumping operation in response to toggling the oscillation signal OSC to the predetermined frequency but does not increase the level of the boost voltage terminal by holding off the positive pumping operation in response to setting the oscillation signal OSC to the predetermined logic level with no toggling the oscillation signal OSC.

Among the constituent elements of the under-driving unit 160, the under-driving operation controller 162 activates the under-driving operation control signal UDOP_CTRL in response to the transition of the operation mode control signal OPMD_CTRL from the activation state to the inactivation state and inactivates the under-driving operation control signal UDOP_CTRL after a predetermined time elapsed.

Among the constituent elements of the under-driving unit 160, the under driver 164 decreases a level of the boost voltage VPP terminal to a level of the supply voltage VDD by driving the boost voltage VPP terminal with the supply voltage VDD in response to the activation of the under-driving operation control signal UDOP_CTRL.

As described above, the internal voltage generating circuit of the phase change memory device in accordance with the present embodiment generates the divided voltage DIV_VOL by dividing the boost voltage VPP level using the divided voltage generator 100. Here, a division ratio of the boost voltage VPP level is changed in response to a value of the operation mode control signal OPMD_CTRL.

The divided voltage DIV_VOL from the divided voltage generator 100 is applied to the voltage detector 120, and the voltage detector 120 detects a level of the divided voltage DIV_VOL based on a reference voltage VREFP level. Here, the operation of the divided voltage generator 100 provides the same effect of changing a detection target level although the reference voltage level is not changed. The reference voltage level is the detection target level of the voltage detector 120.

For example, if a level of the reference voltage VREFP is 1.1V and if the divided voltage generator 100 divides the level of the boost voltage VPP by 5, a target level of the boost voltage VPP becomes 5.5V in the voltage detector 120. However, if the level of the boost voltage VPP is divided by 3 in the divided voltage generator 100, the level of the boost voltage VPP becomes 3.3V, which is a target level in the voltage detector 120. Therefore, the operation of the divided voltage generator 100 provides the same effect of changing the detection target level without changing the level of the reference voltage VREFP, which is the detection target level of the voltage detector 120.

The internal voltage generator 140 increases the level of the boost voltage VPP terminal by selectively performing a charge pumping operation in response to an output signal OSC_CTRL outputted from the voltage detector 120. Here, the internal voltage generator 140 does not forcedly drop the level of the boost voltage VPP terminal when the internal voltage generator 140 does not perform a charge pumping operation but operates to increase the level of the boost voltage VPP terminal.

The under-driving unit 160 drops the level of the boost voltage VPP to a level of the supply voltage VDD in the activation region of the under-driving operation control signal UDOP_CTRL corresponding to the operation mode control signal OPMD_CTRL. The operation mode control signal OPMD_CTRL is a signal for deciding whether the phase change memory device operates in a programming operation mode or in read/standby operation modes. When the operation mode control signal OPMD_CTRL is activated to logic high, the phase change memory device operates as the read/standby operation modes. When the operation mode control signal OPMD_CTRL is inactivated to logic low, the phase change memory device operates in the programming operation mode. That is, the under-driving unit 160 drops the level of the boost voltage VPP terminal to the level of the supply voltage VDD when the phase change memory device escapes from the programming operation mode to the read/standby modes.

Figure 2A:
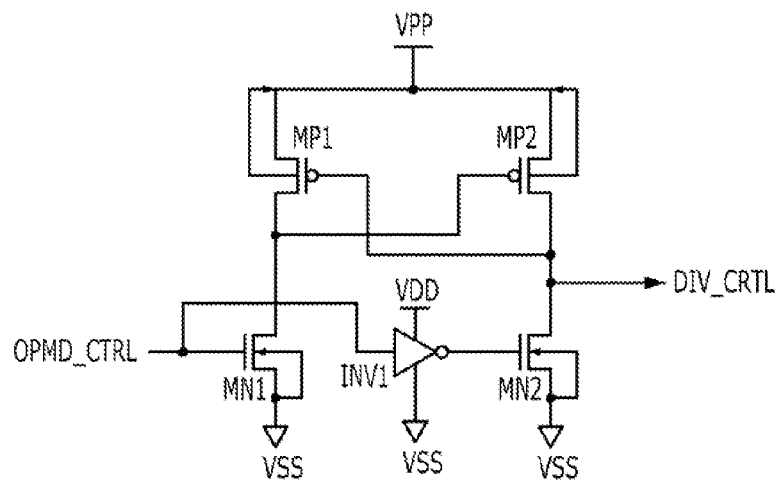
FIG. 2A is a circuit diagram illustrating a division control signal generator of a divided voltage generator in a boost voltage generating circuit of a phase change memory device of FIG. 1.

FIG. 2A is a circuit diagram illustrating a division control signal generating unit of a divided voltage generator in a boost voltage generating circuit of a phase change memory device of FIG. 1.

Figure 2B:
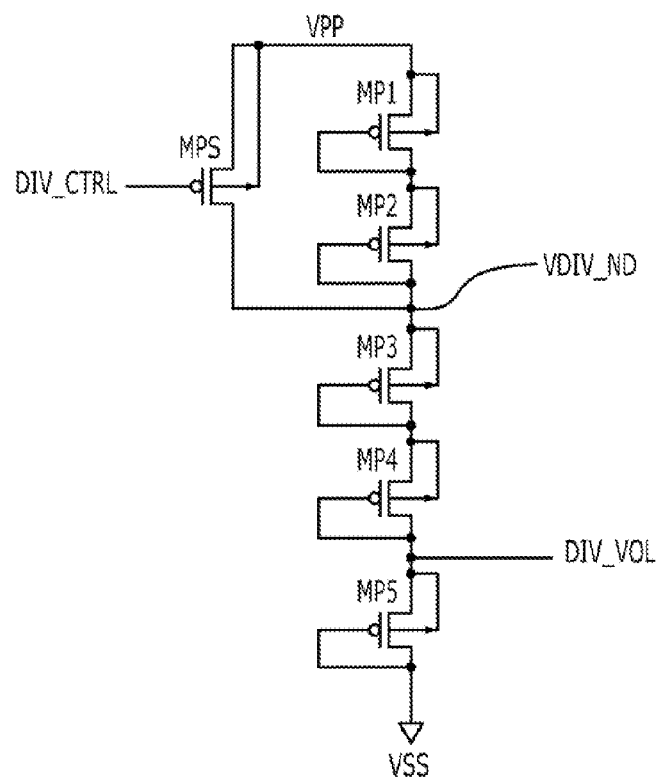
FIG. 2B is a circuit diagram illustrating a voltage divider of a divided voltage generator in a boost voltage generating circuit of a phase change memory device of FIG. 1.

FIG. 2B is a circuit diagram illustrating a voltage divider of a divided voltage generator in a boost voltage generating circuit of a phase change memory device of FIG. 1.

Referring to FIG. 2A, the division control signal generator 102, which is included in the divided voltage generator 100 among the constituent elements of the boost voltage generating circuit of the phase change memory device in accordance with the present embodiment, receives an operation mode control signal OPMD_CTRL that has an upper limit level swinging between the supply voltage VDD to the ground voltage VSS. The division control signal generator 102 generates the division control signal DIV_CTRL swinging between the boost voltage VPP and the ground voltage VSS by shifting the upper limit level of the operation mode control signal OPMD_CTRL from the level of the supply voltage VDD to the level of the boost voltage VPP. That is, the division control signal generator 102 may be a typical level shifting circuit.

As described above, the operation of the voltage divider 104 is controlled using the division control signal DIV_CTRL swinging between the boost voltage VPP and the ground voltage VSS without directly using the operation mode control signal OPMD_CTRL swinging between the supply voltage VDD and the ground voltage VSS because the voltage being divided by the voltage divider 102 may be selected to be the boost voltage VPP that has a level higher than that of the supply voltage VDD.

That is, when an operation of dividing the boost voltage VPP having a level higher than the supply voltage VDD is performed, a voltage division operation may not be performed normally if the voltage division operation is performed using the operation mode control signal OPMD_CTRL swinging between the supply voltage VDD and the ground voltage VSS. Therefore, the operation of dividing the boost voltage VPP is performed using the division control signal DIV_CTRL swinging between the boost voltage VPP and the ground voltage VSS.

Referring to FIG. 2B, the voltage divider 104, which is included in the divided voltage generator 100 among the constituent elements of the boost voltage generating circuit of the phase change memory device in accordance with the present embodiment, includes a plurality of diode type pull-up PMOS transistors MP1, MP2, MP3, and MP4 connected between the boost voltage VPP terminal for dividing the boost voltage VPP level and the divided voltage DIV_VOL terminal, a diode type pull-down PMOS transistor MP5 connected between the divided voltage DIV_VOL terminal and the ground voltage VSS terminal, and a switch PMOS transistor MPS determines the number of PMOS transistors among the plurality of diode type pull-up PMOS transistors MP1, MP2, MP3, and MP4 used to divide the boost voltage VPP level in response to the division control signal DIV_CTRL.

The operation of the voltage divider 104 will be described. When the division control signal DIV_CTRL has the boost voltage VPP level, the switch PMOS transistor MPS is turned off. As a result, the voltage divider 104 generates a divided voltage DIV_VOL by dividing the boost voltage VPP level using all of the plurality of diode type pull-up PMOS transistors MP1, MP2, MP3, and MP4 and the diode type pull-down PMOS transistor MP5. That is, since the divided voltage DIV_VOL terminal is disposed between the plurality of diode type pull-up PMOS transistors MP1, MP2, MP3, and MP4 and the diode type pull-down PMOS transistor MP5, the divided voltage DIV_VOL is generated by dividing the boost voltage VPP level by 5.

On the contrary, when the division control signal DIV_CTRL has the ground voltage VSS level, the switch PMOS transistor MPS is turned on. As a result, the divided voltage DIV_VOL is generated by dividing the boost voltage VPP level using only some of the diode type pull-up PMOS transistors, for example, MP3 and MP4 and the diode type pull-down PMOS transistor among the plurality of diode type pull-up PMOS transistors MP1, MP2, MP3, and MP4. That is, the boost voltage VPP is applied to variable division nodes VDIV_ND of the second and third diode type pull-up PMOS transistors MP2 and MP3 by the switch PMOS transistor MPS, and the divided voltage DIV_VOL is generated by dividing the boost voltage VPP level by 3 because the divided voltage DIV_VOL terminal is between the plurality of diode type pull-up PMOS transistors MP1, MP2, MP3, and MP4, and the diode type pull-down PMOS transistor MP5.

For reference, since the switch PMOS transistor MPS has a source connected to the boost voltage VPP terminal and a drain connected to the variable division node VDIV_ND, it is necessary to increase an upper limit level of the division control signal DIV_CTRL applied to a gate to the boost voltage VPP in order to completely turn off the switch PMOS transistor MPS.

In FIG. 2B, the variable division node VDIV_ND is disposed between the second and third diode type pull-up PMOS transistors MP2 and MP3. However, the present invention is not limited thereto.

Figure 3A:
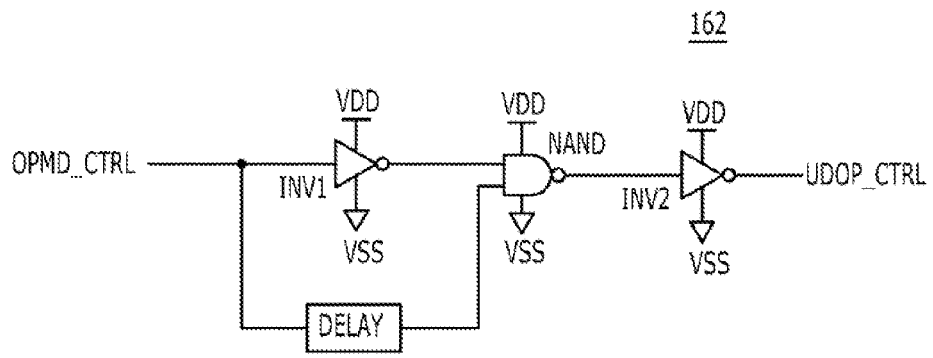
FIG. 3A is a circuit diagram illustrating an under-driving operation controller of an under-driving unit in a boost voltage generating circuit of a phase change memory device of FIG. 1.

FIG. 3A is a circuit diagram illustrating an under-driving operation controller included in an under-driving unit in a boost voltage generating circuit of a phase change memory device of FIG. 1.

Figure 3B:
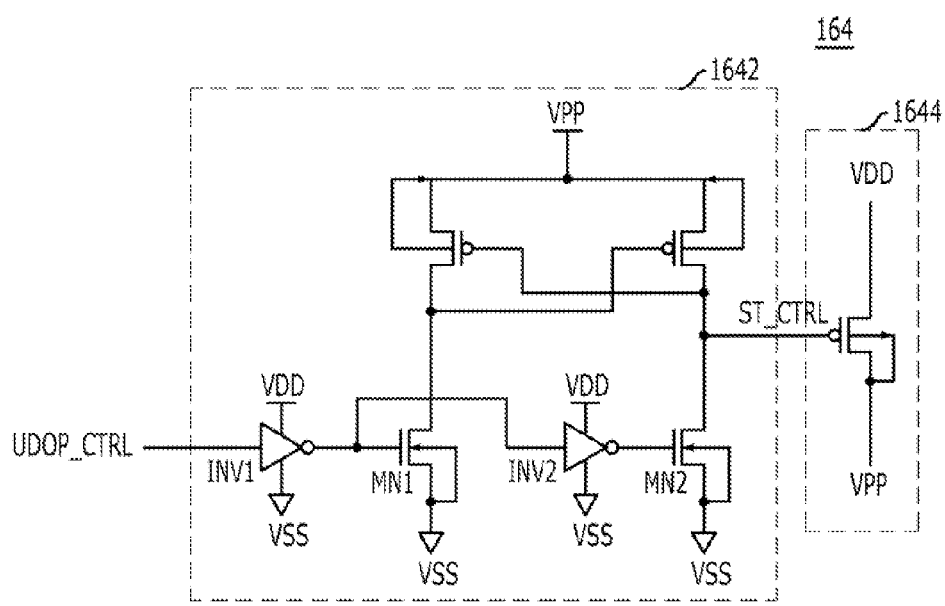
FIG. 3B is a circuit diagram illustrating an under-driver of an under-driving unit in a boost voltage generating circuit of a phase change memory device of FIG. 1.

FIG. 3B is a circuit diagram illustrating an under-driver included in an under-driving unit in a boost voltage generating circuit of a phase change memory device of FIG. 1.

Referring FIG. 3A, the under-driving operation controller 162, which is included in the under-driving unit 160 among the constituent elements of the boost voltage generating circuit of the phase change memory device in accordance with the present invention, includes a first inverter for receiving the operation mode control signal OPMD_CTRL, inverting a phase of the operation mode control signal OPMD_CTRL, and outputting the inverted phase, a delay for receiving the operation mode control signal OPMD_CTRL, delaying the operation mode control signal OPMD_CTRL as long as a predetermined time, and outputting the delayed operation mode control signal OPMD_CTRL, an NAND gate for receiving the output signal of the first inverter INV1 and the output signal of the delay, performing a NAND operation on the received output signals, and outputting the result of the NAND operation, and a second inverter INV2 for receiving the output signal of the NAND gate, inverting a phase of the received output signal, and outputting the inverted phase as the under-driving operation control signal UDOP_CTRL.

Since the first and second inverters INV1 and INV2 and the NAND gate operate with the supply voltage VDD and the ground voltage VSS as power source, the input/output signals also swing between the levels of the supply voltage VDD and the ground voltage VSS.

That is, the under-driving operation controller 162 operates as follows. When the operation mode control signal OPMD_CTRL continuously sustains an activated logic high state or when the operation mode control signal OPMD_CTRL continuously sustains an inactivated logic low state, the under-driving operation control signal UDOP_CTRL is in an inactivation state as logic low.

When the operation mode control signal OPMD_CTRL is activated to a logic high state from an inactivated logic low state, the under-driving operation control signal is in an inactivated logic low state.

However, when the operation mode control signal OPMD_CTRL is inactivated to a logic low state from the activated logic high state, the under-driving operation control signal UDOP_CTRL is activated for a time corresponding to a delay amount of the delay. That is, when the phase change memory device starts operating in the read/standby operation mode after ending the operation in the programming operation mode, the under-driving operation control signal UDOP_CTRL is activated for a time corresponding to a delay amount of the delay.

Referring to FIG. 3B, the under-driver 164, which is included in the under-driving unit 160 among the constituent elements of the boost voltage generating circuit of the phase change memory device in accordance with the present embodiment, includes a level shifter 1642 for receiving the under-driving operation control signal UDOP_CTRL swinging between the levels of the supply voltage VDD and the ground voltage VSS and shifting an upper limit level of the under-driving operation control signal UDOP_CTRL to the level of the boost voltage VPP, and a short driver 1644 for driving the boost voltage VPP terminal by shorting the boost voltage VPP terminal and the supply voltage VDD terminal during an activation region of the under-driving operation control signal UDOP_CTRL outputted through the level shifter 1642.

Here, the level shifter 1642 has the same structure of the division control signal generator 102 shown in FIG. 2A. However, unlike the division control signal generator 102, the level shifter 1642 receives a signal having an inverted phase of the under-driving operation control signal UDOP_CTRL and outputs a signal outputted from the short driver 1644. That is, the level shifter 1642 may be a typical level shifting circuit.

The short driver 1644 shorts the boost voltage VPP terminal and the supply voltage VDD or opens the boost voltage VPP terminal and the supply voltage VDD in response to a signal ST_CTRL outputted from the level shifter 1642. That is, when the signal ST_CTRL outputted from the level shifter 1642 has a ground voltage VSS level, the short driver 1644 shorts the boost voltage VPP terminal and the supply voltage VDD. When the signal ST_CTRL outputted from the level shifter 1642 has the boost voltage VPP level, the short driver 1644 opens the boost voltage VPP terminal and the supply voltage VDD.

Since a target to perform under-driving in the short driver 1644 is the boost voltage VPP terminal, the level shifter 1642 further includes the under-driving unit 160 as well as the short driver 1644 that performs a substantial operation of the under-driving unit 160 which is an operation of under-driving the supply voltage VDD at the boost voltage VPP terminal.

That is, when the under-driving operation control signal UDOP_CTRL swings between the supply voltage VDD and the ground voltage VSS without being level-shifted, the short driver 1644 can short the supply voltage VDD terminal and the boost voltage VPP terminal without a problem. However, the short driver 1644 may not perfectly open the supply voltage VDD terminal and the boost voltage VPP terminal.

FIG. 4 is a timing diagram showing operation of an internal voltage generating circuit of a phase change memory device in accordance with an embodiment of the present invention.

Referring to FIG. 4, the phase change memory device enters a programming operation mode when the operation mode control signal OPMD_CTRL is in a logic high state having the supply voltage VDD level (1.8V). The phase change memory device enters read/standby operation modes when the operation mode control signal OPMD_CTRL is in a logic low state having a ground voltage VSS level (0V).

In more detail, when the phase change memory device is in the programming operation mode because the operation mode control signal OPMD_CTRL sustains a logic high state having the supply voltage VDD level (1.8V), the division control signal DIV_CTRL becomes a logic high state having the boost voltage VPP level (5.5V). Accordingly, the under-driving operation control signal UDOP_CTRL sustains a logic low state having the ground voltage VSS level (0V) and the under-driving unit 160 does not perform any operation. As a result, the level of the boost voltage VPP terminal is stabilized at 5.5V.

However, when the phase change memory device ends the programming operation mode and enters to the read/standby operation mode because the operation mode control signal OPMD_CTRL changes from the logic high state having the supply voltage VDD level (1.8V) to the logic low state having the ground voltage VSS level (0V), the division control signal DIV_CTRL changes from the logic high state having the boost voltage VPP level (5.5V) to the logic low state having the ground voltage VSS level (0V). Accordingly, the under-driving operation control signal UDOP_CTRL changes from the logic low state having the ground voltage VSS level (0V)

to the logic high state having the supply voltage VDD level (1.8V) and the under-driving unit 160 under-drives the boost voltage VPP terminal to the supply voltage VDD. Therefore, the level of the boost voltage VPP terminal abruptly decreases from 5.5.V to 1.8V which is the supply voltage VDD level.

After then, when the phase change memory device sustains the read/standby operation mode because the operation mode control signal OPMD_CTRL sustains the logic low state having the ground voltage VSS level (0V), the under-driving operation control signal UDOP_CTRL sustains the logic low state having the ground voltage VSS level (0V) again and the under-driving unit 160 performs no operation. Therefore, the level of the boost voltage VPP terminal increases from 1.8V to 3.3V which is the supply voltage VDD level and then is stabilized. Here, the level of the boost voltage VPP terminal is stabilized at 5.5V in the programming operation mode, and the level of the boost voltage VPP terminal is stabilized at 3.3V in the read/standby operation mode. It is because a division ratio (for example, a voltage division ratio) of the voltage divider 104 becomes comparatively large when the phase change memory device performs the programming operation mode by the operation mode control signal OPMD_CTRL in the logic high state having the supply voltage VDD level (1.8V). It is also because the division ratio of the voltage divider 104 becomes comparatively small when the phase change memory device performs the read/standby operation mode by the operation mode control signal OPMD_CTRL in the logic low state having the ground voltage VSS level (0V).

As described above, the internal voltage generating circuit in accordance with the present embodiment increases the target level of the boost voltage VPP generated through the charge pumping operation to be comparatively high at about 5.5V in the programming operation mode and decreases the target level of the boost voltage VPP to be comparatively low at about 3.3V in the read/standby operation mode in the phase change memory device. That is, the internal voltage generating circuit in accordance with the present embodiment sets up the target level of the boost voltage VPP differently according to the operation modes, the programming operation mode and the read/standby operation mode. Therefore, the internal voltage generating circuit in accordance with the present embodiment can enable the phase change memory device to stably perform the programming operation using the sufficient high level boost voltage VPP in the programming operation mode and can enable the phase change memory device to stably perform the read/standby operation using the sufficient low level boost voltage VPP in the read/standby operation mode. Furthermore, the internal voltage generating circuit in accordance with the present embodiment enables the phase change memory device to minimize power consumption.

While the present invention has been described with respect to the specific embodiments, it will be apparent to those skilled in the art that various changes and modifications may be made without departing from the spirit and scope of the invention as defined in the following claims.

For example, although the abovementioned embodiments were exemplary described to generate the boost voltage VPP, the present invention is not limited thereto. The internal voltage generating circuit in accordance with the present invention can be applied to any voltage generated through the charge pumping operation, such as a back-bias voltage VBB.

Also, locations and types of logic gates and transistors described in the above mentioned embodiments may be embodied differently based on a polarity of an input signal.

The internal voltage generating circuit in accordance with the present invention sets up a target level of an internal voltage generated through a charge pumping operation differently based on a programming operation mode and a read/standby operation mode. Therefore, the internal voltage generating circuit in accordance with the present invention can enable stable performance of a program operation by generating an internal voltage having a sufficient high level in a programming operation mode and also enable stable performance of a read/standby operation by generating an internal voltage having a sufficient low level in a read/standby operation mode. Furthermore, the internal voltage generating circuit in accordance with the present invention can minimize power consumption.

For example, the number of the delay units included in the delay line in the aforementioned embodiment of the present invention may be different from that illustrated in the drawings. That is, the cases where the number of the delay units of the delay line is greater or smaller than the number of delay units illustrated in the drawings also fall within a scope of the present invention.

What is claimed is:

1. A method for generating an internal voltage of a phase change memory device, comprising:
    generating a divided voltage by dividing an internal voltage level with a first division ratio in a programming operation mode corresponding to an operation mode control signal;
    generating the divided voltage by dividing the fed-back internal voltage level with a second division ratio in a read/standby operation mode corresponding to the operation mode control signal wherein the second division ratio is smaller than the first division ratio;
    detecting the divided voltage level based on a reference voltage level and generating the internal voltage based on a charge pumping method in response to the detection result; and
    under-driving an internal voltage terminal with a supply voltage for a predetermined time when the phase change memory device enters a read/standby operation mode corresponding to the operation mode control signal.

2. The method of claim 1, wherein the generating of the divided voltage by dividing an internal voltage level with a first division ration in a programming operation mode includes:
    shifting a level of the operation mode control signal to a level of the internal voltage in the programming operation mode when the operation mode control signal has a supply voltage level and outputting the level shifted operation mode control signal as a division control signal; and
    generating the divided voltage by dividing the level of the internal voltage with the first division ratio in response to the division control signal having the internal voltage level.

3. The method of claim 2, wherein the generating of the divided voltage by dividing the fed-back internal voltage level with a second division ratio in a read/standby operation mode includes:
    outputting the division control signal having a ground voltage level identical to the operation mode control signal in the read/standby operation mode when the operation mode control signal has a ground voltage level; and
    generating the divided voltage by dividing the internal voltage level with the second division ration in response to the division control signal having a ground voltage level.

4. The method of claim 3, wherein the dividing the internal voltage level with the first division ratio is dividing the internal voltage level by a factor of 5.

5. The method of claim 4, wherein the dividing the internal voltage level with the second division ratio is dividing the internal voltage level by a factor of 3.

6. The method of claim 1 wherein the generating of the internal voltage based on a charge pumping method includes.
   generating a voltage detection signal by detecting a level of the divided voltage based on the reference voltage level:
   generating an oscillation signal toggling to a redetermined frequency in response to the voltage detection signal; and
   increasing a level of an internal voltage terminal by performing a positive charge pumping operation in response to the oscillation signal.

7. The method of claim 6, wherein the generating of a voltage detection signal includes:
   activating the voltage detection signal when the level of the divided voltage is lower than the reference voltage level and outputting the activated voltage detection signal; and
   inactivating the voltage detection signal when the level of the divided voltage is higher than the reference voltage level and outputting the inactivated voltage detection signal.

8. The method of claim 7, wherein the generating of an oscillation signal includes:
   toggling the oscillation signal to a predetermined frequency in response to the activated voltage detection signal; and
   setting the oscillation signal to a predetermined level, without toggling, in response to the inactivated voltage detection signal.

9. The method of claim 8, wherein the increasing of the level of an internal voltage terminal includes:
   increasing the level of the internal voltage terminal by performing a positive charge pumping operation in response to the oscillation signal toggling to a predetermined frequency; and
   not increasing the level of the internal voltage terminal by holding off a positive charge pumping operation in response to the oscillation signal being set at a predetermined level without toggling.

10. The method of claim 1, wherein the under-driving of an internal voltage terminal with a supply voltage includes:
    generating an under-driving operation control signal activated for a predetermined time when the phase change memory device enters the read/standby operation mode corresponding to shifting of the operation mode control signal from a supply voltage level to a ground voltage level; and
    under-driving a level of an internal voltage terminal to a supply voltage level in an activation region of the under-driving operation control signal.

11. The method of claim 10, wherein the under-driving of a level of an internal voltage terminal to a supply voltage level includes:
    shifting an upper limit level of the under-driving operation control signal swinging a supply voltage level to a ground voltage level to the internal voltage level; and
    shorting the internal voltage terminal and a supply voltage terminal during an activation region of the under-driving operation control signal outputted through the shifting of the upper limited level of the under-driving operation control signal.

* * * * *